United States Patent
Cordero et al.

(10) Patent No.: US 10,127,100 B2
(45) Date of Patent: Nov. 13, 2018

(54) CORRECTING A DATA STORAGE ERROR CAUSED BY A BROKEN CONDUCTOR USING BIT INVERSION

(71) Applicant: International Business Machines Corporation, Armonk, NY (US)

(72) Inventors: Edgar R. Cordero, Round Rock, TX (US); Briana E. Foxworth, Austin, TX (US); Andre A. Marin, Round Rock, TX (US); Kevin M. McIlvain, Delmar, NY (US); Lucas W. Mulkey, Austin, TX (US); Anuwat Saetow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 15/172,497

(22) Filed: Jun. 3, 2016

(65) Prior Publication Data

US 2017/0351566 A1    Dec. 7, 2017

(51) Int. Cl.
   *G06F 11/00* (2006.01)
   *G06F 11/07* (2006.01)
   (Continued)

(52) U.S. Cl.
   CPC ........ *G06F 11/0793* (2013.01); *G06F 11/079* (2013.01); *G06F 11/0727* (2013.01); *G06F 11/0754* (2013.01); *G11C 7/1006* (2013.01); *G11C 11/4096* (2013.01); *G11C 29/022* (2013.01); *G11C 29/025* (2013.01); *G11C 29/52* (2013.01)

(58) Field of Classification Search
   CPC . G06F 11/0727; G06F 11/076; G06F 11/0793
   See application file for complete search history.

(56) References Cited

U.S. PATENT DOCUMENTS 6,170,078 B1 * 1/2001 Erle ............... G01R 31/318342
                                                          714/25
6,452,865 B1    9/2002 Wolford
(Continued)

OTHER PUBLICATIONS

P. Mell et al., "The Nist Definition of Cloud Computing", National Institute of Standards and Technology, Information Technology Laboratory, Sep. 2011, pp. 1-7.
(Continued)

*Primary Examiner* — Elmira Mehrmanesh
(74) *Attorney, Agent, or Firm* — Law Office of Jim Boice

(57) ABSTRACT

A method, system, and/or computer program product corrects a data error that has been caused by a break in a conductor link in a memory. A memory controller detects a line malfunction in a data bit transmission line between a first bit node and a second bit node in a memory, and then identifies a constant voltage state at the second bit node that is caused by the line malfunction. In response to determining that the constant voltage state is non-representative of the bit value intended to be transmitted from the first bit node to the second bit node, an inversion logic inverts bit values for all bits in an original bit array to create an inverted bit array, which is stored in the array of memory cells for future retrieval and re-inversion, in order to reconstruct the original bit array.

20 Claims, 13 Drawing Sheets

(51) Int. Cl.
*G11C 11/4096* (2006.01)
*G11C 7/10* (2006.01)
*G11C 29/02* (2006.01)
*G11C 29/52* (2006.01)

(56) References Cited

U.S. PATENT DOCUMENTS

| | | | |
|---|---|---|---|
| 7,221,292 B2 | 5/2007 | Hein | |
| 7,280,412 B2 | 10/2007 | Jang et al. | |
| 7,522,073 B1 | 4/2009 | Kao | |
| 7,616,133 B2 | 11/2009 | Hollis | |
| 7,793,143 B2 * | 9/2010 | Cordero | G06F 11/10 714/38.14 |
| 7,869,525 B2 | 1/2011 | Macri et al. | |
| 8,049,510 B2 * | 11/2011 | Queck | H04L 12/40006 324/500 |
| 8,176,240 B2 | 5/2012 | Wilcox et al. | |
| 9,048,856 B2 | 6/2015 | Hollis | |
| 9,432,298 B1 * | 8/2016 | Smith | H04L 49/9057 |
| 2005/0289435 A1 * | 12/2005 | Mulla | G06F 11/10 714/758 |
| 2012/0020154 A1 * | 1/2012 | Namiki | G11C 16/0483 365/185.03 |
| 2012/0166904 A1 * | 6/2012 | Bandholz | G06F 11/1048 714/746 |
| 2015/0095748 A1 * | 4/2015 | Abbasfar | G06F 11/1004 714/819 |
| 2017/0133082 A1 * | 5/2017 | Sankaranarayanan | G11C 11/4093 |

OTHER PUBLICATIONS

A. Lin et al., "A DDR SDRAM Interface Employing Exiting SDR SDRAM Controller", ip.com, No. 000021936, Feb. 16, 2004, pp. 1-5.

Anonymous, "Method and System for Address Data Pin Multiplexing in Memory Controller Design", ip.com, No. 000228578, Jun. 19, 2013, pp. 1-4.

* cited by examiner

CORRECTING A DATA STORAGE ERROR CAUSED BY A BROKEN CONDUCTOR USING BIT INVERSION

BACKGROUND

The present disclosure relates to the field of computers, and specifically to the field of memory in computers. Still more specifically, the present disclosure relates to the field of storing data in a memory in a system that has a broken connection to or within the memory.

Memory subsystems have many components that can fail. Determining the root cause of such failures can be very difficult. Furthermore, maintaining functionality of the memory that has failed may require redundancy systems, which are often expensive.

SUMMARY

A method, system, and/or computer program product corrects a data error that has been caused by a break in a conductor link in a memory. The memory receives an original bit array at an input/output interface on the memory. A memory controller detects a line malfunction in a data bit transmission line between a first bit node and a second bit node, where the first bit node is in the input/output interface in the memory, where the second bit node is in an array of memory cells in the memory, where the transmission line was architected to transmit a bit value from the first bit node to the second bit node, and where the bit value is part of the original bit array received at the input/output interface. In response to detecting the line malfunction, the memory controller identifies a constant voltage state at the second bit node that is caused by the line malfunction. In response to determining that the constant voltage state is non-representative of the bit value intended to be transmitted from the first bit node to the second bit node, an inversion logic inverts bit values for all bits in the original bit array to create an inverted bit array. The memory controller then stores the inverted bit array in the array of memory cells. A request for the original bit array is subsequently received from a requesting device. In response to receiving the request for the original bit array, the memory controller transmits the inverted bit array from the array of memory cells to the input/output interface. The inversion logic then inverts the inverted bit array at the input/output interface to reconstruct the original bit array, and the memory controller then transmits the reconstructed original bit array to the requesting device.

In one embodiment of the present invention, a method, computer program product, and/or computer system correct a bit array being transmitted from a memory controller to a dynamic random access memory (DRAM). The memory controller detects a line malfunction in a data bit transmission line between the memory controller and the DRAM. In response to detecting the line malfunction, the memory controller identifies a constant voltage state at a bit node in the DRAM caused by the line malfunction. In response to determining that the constant voltage state is non-representative of the bit value intended to be transmitted to the DRAM, the memory controller inverts bit values for all bits in an original bit array to create an inverted bit array, and transmits the inverted bit array to the DRAM. The memory controller then directs the DRAM to re-invert the inverted bit array to re-create the original bit array, which is stored in the DRAM. In response to receiving a request for the original bit array, the memory controller re-inverts the original bit array stored in the DRAM to re-create the inverted bit array, which is transmitted from the DRAM to the memory controller. The memory controller then re-inverts the inverted bit array to re-create the original bit array.

DETAILED DESCRIPTION

Figure 1:
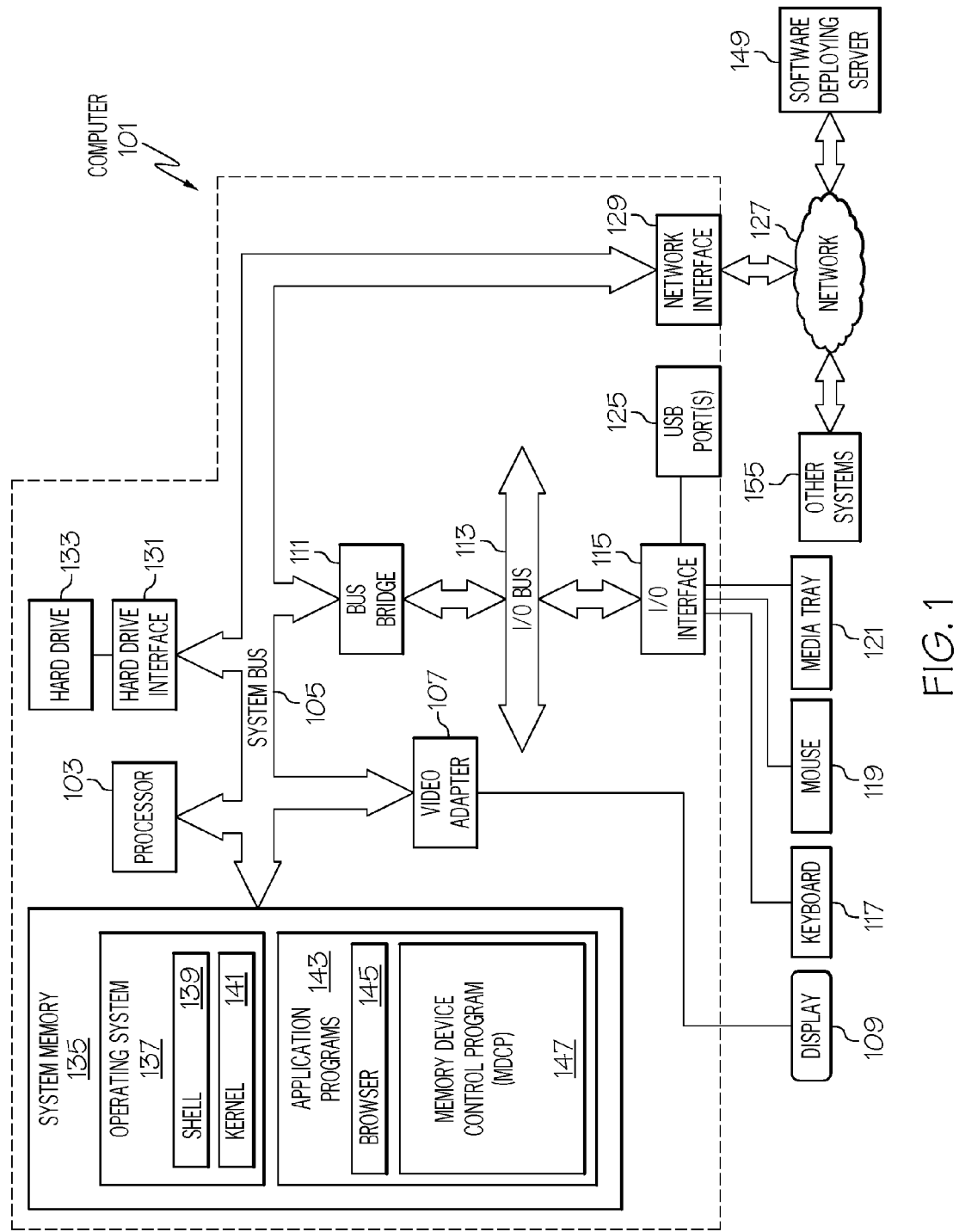
FIG. 1 depicts an exemplary system and network in which the present disclosure may be implemented.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

With reference now to the figures, and in particular to FIG. 1, there is depicted a block diagram of an exemplary system and network that may be utilized by and/or in the implementation of the present invention. Some or all of the exemplary architecture, including both depicted hardware and software, shown for and within computer 101 may be utilized by software deploying server 149 and/or other systems 155 shown in FIG. 1.

Exemplary computer 101 includes a processor 103 that is coupled to a system bus 105. Processor 103 may utilize one or more processors, each of which has one or more processor cores. A video adapter 107, which drives/supports a display 109, is also coupled to system bus 105. System bus 105 is coupled via a bus bridge 111 to an input/output (I/O) bus 113. An I/O interface 115 is coupled to I/O bus 113. I/O interface 115 affords communication with various I/O devices, including a keyboard 117, a mouse 119, a media tray 121 (which may include storage devices such as CD-ROM drives, multi-media interfaces, etc.), and external USB port(s) 125. While the format of the ports connected to I/O interface 115 may be any known to those skilled in the art of computer architecture, in one embodiment some or all of these ports are universal serial bus (USB) ports.

As depicted, computer 101 is able to communicate with a software deploying server 149 and/or other systems 155 using a network interface 129. Network interface 129 is a hardware network interface, such as a network interface card (NIC), etc. Network 127 may be an external network such as the Internet, or an internal network such as an Ethernet or a virtual private network (VPN). In one or more embodiments, network 127 is a wireless network, such as a Wi-Fi network, a cellular network, etc.

A hard drive interface 131 is also coupled to system bus 105. Hard drive interface 131 interfaces with a hard drive 133. In one embodiment, hard drive 133 populates a system memory 135, which is also coupled to system bus 105. System memory is defined as a lowest level of volatile memory in computer 101. This volatile memory includes additional higher levels of volatile memory (not shown), including, but not limited to, cache memory, registers and buffers. Data that populates system memory 135 includes computer 101's operating system (OS) 137 and application programs 143.

OS 137 includes a shell 139, for providing transparent user access to resources such as application programs 143. Generally, shell 139 is a program that provides an interpreter and an interface between the user and the operating system. More specifically, shell 139 executes commands that are entered into a command line user interface or from a file. Thus, shell 139, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 141) for processing. While shell 139 is a text-based, line-oriented user interface, the present invention will equally well support other user interface modes, such as graphical, voice, gestural, etc.

As depicted, OS 137 also includes kernel 141, which includes lower levels of functionality for OS 137, including providing essential services required by other parts of OS 137 and application programs 143, including memory management, process and task management, disk management, and mouse and keyboard management.

Application programs 143 include a renderer, shown in exemplary manner as a browser 145. Browser 145 includes program modules and instructions enabling a world wide web (WWW) client (i.e., computer 101) to send and receive network messages to the Internet using hypertext transfer protocol (HTTP) messaging, thus enabling communication with software deploying server 149 and other systems.

Application programs 143 in computer 101's system memory (as well as software deploying server 149's system memory) also include a Memory Device Control Program (MDCP) 147. MDCP 147 includes code for implementing the processes described below, including those described in FIGS. 2-11. In one embodiment, computer 101 is able to download MDCP 147 from software deploying server 149, including in an on-demand basis, wherein the code in MDCP 147 is not downloaded until needed for execution. In one embodiment of the present invention, software deploying server 149 performs all of the functions associated with the present invention (including execution of MDCP 147), thus freeing computer 101 from having to use its own internal computing resources to execute MDCP 147.

The hardware elements depicted in computer 101 are not intended to be exhaustive, but rather are representative to highlight essential components required by the present invention. For instance, computer 101 may include alternate memory storage devices such as magnetic cassettes, digital versatile disks (DVDs), Bernoulli cartridges, and the like. These and other variations are intended to be within the spirit and scope of the present invention.

In one or more embodiments, the present invention focuses on a data line (called "DQ" in double data rate (DDR) dynamic random access memory (DRAM) systems) interconnection from the memory controller side input/output (I/O) to the I/O of the DRAM memory device. This space is susceptible to many different types of issues that could cause a fail. For example, a single DQ bit line could fail due to a bad I/O on either end, issues with the packaging on either end (vias, routing, etc.), poor board routing (coupling to other nets, one DQ is not balanced well to other DQ lines in the same nibble or byte), bad connectors, etc.

The present invention makes the value of the bit irrelevant under certain circumstances through the use of data inversion. As described herein, the present invention basically ignores a bit in the byte by assigning it to always be a logic "1" or "0" by implementing a modification to the data bus inversion (DBI) logic found in DRAMs such as DDR4 memory subsystems. This method aids in characterization and debugging operations, and also allows for a bit to be "spared" without the addition of additional bit lanes to be deployed (which can be expensive).

DBI (data bus inversion) is a feature that is used in a DDR4 DRAM. As described in the JEDEC specification for DDR4 DRAMs, DBI operations are as follows. When DBI is enabled, a memory controller (MC) can invert a byte, and then set DBI to 0 (active low) in order to indicate that the byte is inverted. The DBI algorithm checks the byte for the number of 0's. If the number of 0's is greater than 4, the byte is inverted (e.g., the byte 0000,0111 would be inverted to 1111,1000). When the byte is received by the DRAM (i.e., at the memory storage cells in the memory), the DBI bit is evaluated. If the DBI bit is 0 (active low), the byte is inverted back to its original value before being stored. The DRAM will perform the same calculation on the read. If the number of 0's in the byte is greater than 4, the byte is inverted and sent back to the physical (PHY) interface with the DBI bit set to 0. The memory controller will evaluate the DBI bit to determine whether to invert the byte.

The present invention modifies the DBI behavior to hold a bit of interest at a specific value, "0" or "1", thus essentially "mapping" the bit of interest onto the DBI line. Instead of using an algorithm which calculates the number of bits which are "0" and inverts the pattern if there are more 0's than 1 's, one or more embodiments of the present invention look at a selected bit to determine if the pattern should be inverted. For example, if the system needs to maintain a bit as a "1" on the interconnect, then the logic would look at the bit of interest and, if it is "0", then the pattern would be inverted and the DBI line would indicate that the pattern is inverted. If the bit was a "1", then the algorithm would not invert the pattern. In both cases the line would be "1". Such actions/behavior are opposite to maintain a "0" on the data line. In order to make this work, both the memory controller and DRAM are modified.

As described in the JEDEC specification for DDR4 DRAMs, DBI is enabled by setting A11 and A12 in MR5. When so enabled, the memory controller (MC) for the DDR4 DRAM can decide to invert the byte and thus set DBI to "0" (active low), thereby indicating that the byte is inverted. When the byte is received by the DRAM, the byte may or may not be inverted back to its original value before being stored.

DBI saves power by reducing the switching on the bus. By default, DDR4 bit lanes are always held at "1" (low voltage, such as less than 0.5 $V_{DC}$) unless the data on the line is to be a "0", which causes the line to switch to a high voltage (e.g., between 3.5 $V_{DC}$ and 5.0 $V_{DC}$). Because of this, the DBI algorithm checks the data byte for the number of 0's. If the number of 0's is greater than four, the byte is inverted (0000,0111 would be inverted to 1111,1000). The DRAM will perform the same calculation on the read. If the number of 0's in the byte is greater than four the byte is inverted and sent back to the PHY with the DBI bit set to "0".

As described herein, the present invention disables (or more accurately, makes irrelevant) a bit in a byte by using the existing DBI functionality with a slight modification. In a scenario in which one bit lane is always bad due to an interconnect issue, I/O failure, etc., this slight modification to the DBI will ignore the bit in the deficient bit lane and still maintain functionality.

The examples shown in FIG. 2-FIG. 6 present an exemplary use of the present invention. It is noted that although FIG. 2-FIG. 6 describe the present invention according to data being transmitted between I/O pins and memory cell arrays in a memory chip (memory 235), the processes described herein are also applicable to data transfers between any two memory sub-components. For example, if there is a break in a line in a bus that connects a DRAM to a system bus (e.g., a bus that connects system memory 135 and system bus 105 shown in FIG. 1), the process described herein for correcting a line break in one of the wires 208 within a memory 235 is also implementable using the processes described herein.

Figure 2:
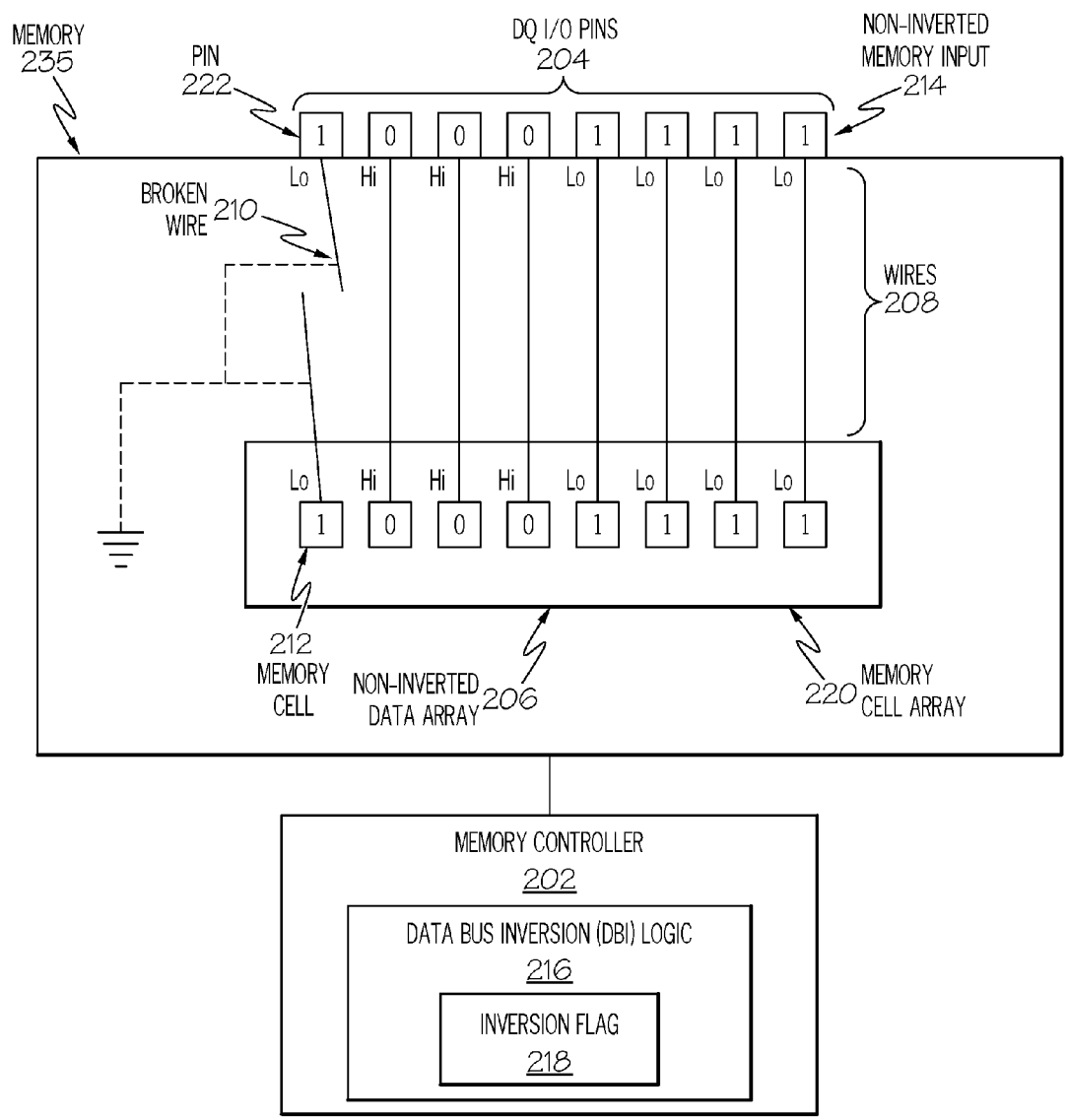
FIG. 2 illustrates a memory in a computer that has a broken wire between an input/output pin and a memory cell.

With reference now to FIG. 2, assume that the byte 1000,1111 (using the bit order of b0 . . . b7) is a non-inverted memory input 214 that is received at the data (DQ) input/output pins 204 on memory 235 (analogous to the dynamic system memory 135 shown in FIG. 1).

As shown in FIG. 2, data is sent from the DQ I/O pins 204 to a memory cell array 220 via a set of wires 208. However, there is a broken wire 210 between pin 222 and memory cell 212. A memory controller 202 or other monitoring device can detect the broken wire 210 by measuring electronic resistance between pin 222 and memory cell 212, detecting anomalous data storage events in memory cell 212, etc.

Note that b0 in the byte 1000,1111 (non-inverted memory input 214) depicted in FIG. 2 is a "1". As such, the broken wire 210 has no impact on the non-inverted data array 206 (1000,1111) that is stored in the memory cell 212, assuming that 1) memory 235 uses a low voltage (e.g., less than 0.5 $V_{DC}$) to store a value of "1", and 2) that the broken wire 210 is grounded (in order to avoid a floating gate in memory cell 212 and to automatically put a "1" into memory cell 212, regardless of what value is attempted to be sent from pin 222). That is, since the broken wire 210 coming from the memory cell 212 is grounded (e.g., by touching a grounded substrate in the memory 235 or a ground wire (not shown) in the memory 235) as shown in FIG. 2, then the value stored in memory cell 212 will always be "1" (assuming that a low voltage causes the content of memory cell 212 to be "1"). Thus, the same byte 1000,1111 found at the DQ I/O pins 204 is the same as the byte (1000,1111) that is stored in the memory array cell 220.

As such, in FIG. 2 the memory controller 202, and more specifically the DBI logic 216 within the memory controller 202, will set the inversion flag 218 at "1" (i.e., DBI is active low, such that setting DBI to 1=no inversion). That is, no action is taken, since b0 is already a "1" (i.e., pin 222 has a "1" on it), and the byte 1000,1111 will be transferred across the wires 208 to the memory cell array 220 with no error.

While the present invention is described according to a scenario in which there is a line break (and resulting short to ground or power), in one or more embodiments the issue is directed to interference from a nearby wire/circuit. That is, while the present invention is discussed in the context of a bit (e.g., bit b0 at pin 222 in FIG. 2) being incorrect due to the broken wire 210, in one or more embodiments of the present invention the problem is caused by line interference. For example, assume that there is no broken wire 210 (i.e., there is an unbroken wire between pin 222 and memory cell 212 in FIG. 2). Nonetheless, assume that there is line interference (e.g., inflicted on one of the wires 208 by other wires from wires 208) that alters the value of bit b0 (at pin 222). The process described below for inverting bytes (arrays of bits) using the DBI logic 216 is the same whether the fault to the value in b0 is caused by a line break or line interference. Such line interference may be from line inductance, capacitance, or other electromagnetic interference caused by other lines.

Figure 3:
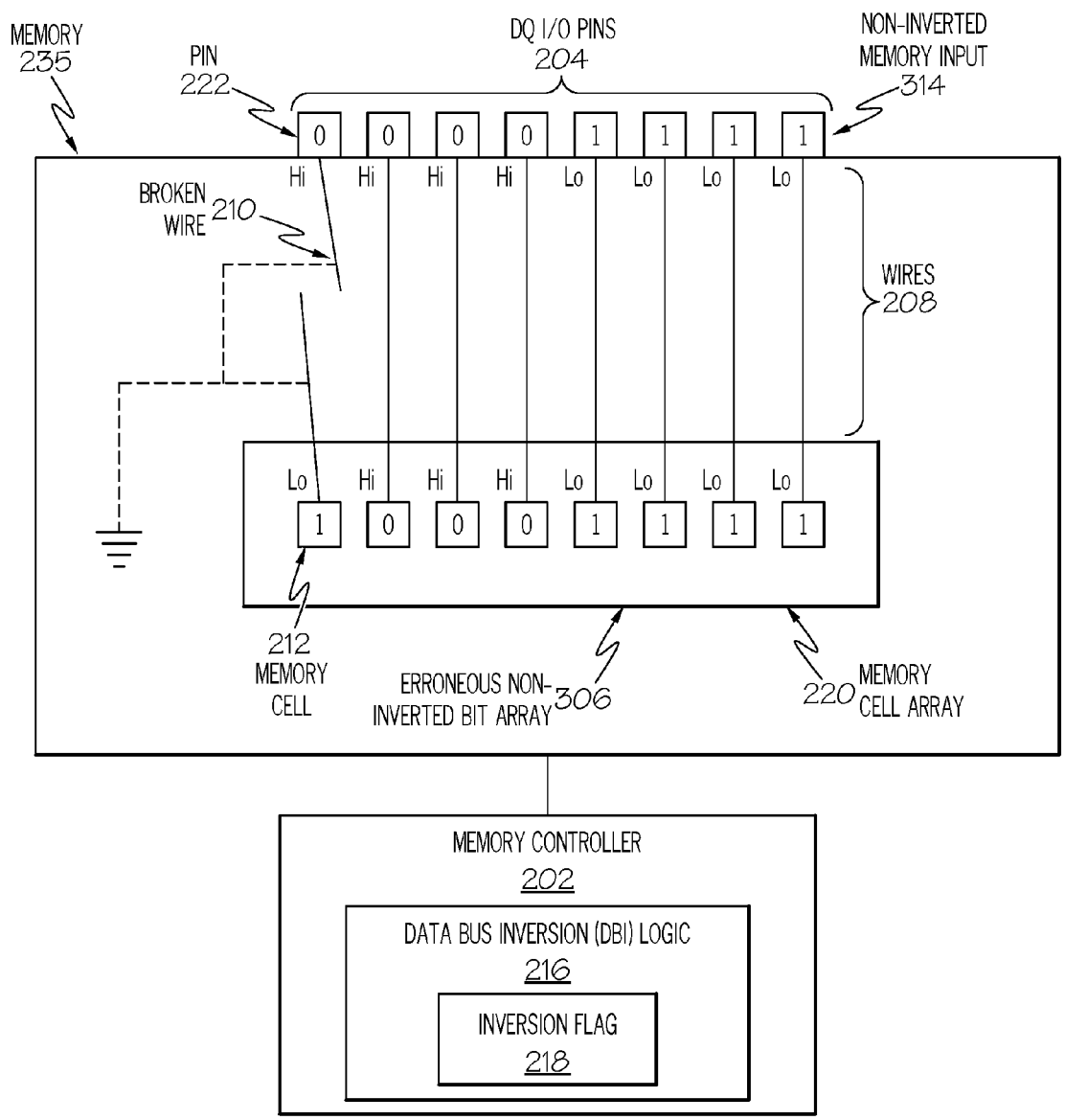
FIG. 3 depicts the memory from FIG. 2 in which a bit in a bit array (e.g., a byte) is incorrectly stored in the memory cells due to the broken wire.

With reference now to FIG. 3, assume that DQ I/O pins 204 have received a new byte (b0 . . . b7) having a value of 0000,1111, depicted as non-inverted memory input 314. The broken wire 210 is still tied to ground, thus causing memory cell 212 to contain a "1", rather than the "0" found at pin 222. As such, without the present invention, the bit array (byte) that would be stored in the memory cell array 220 would be 1000,1111 (depicted as erroneous non-inverted bit array 306), rather than 0000,1111 (non-inverted memory input 314).

Figure 4:
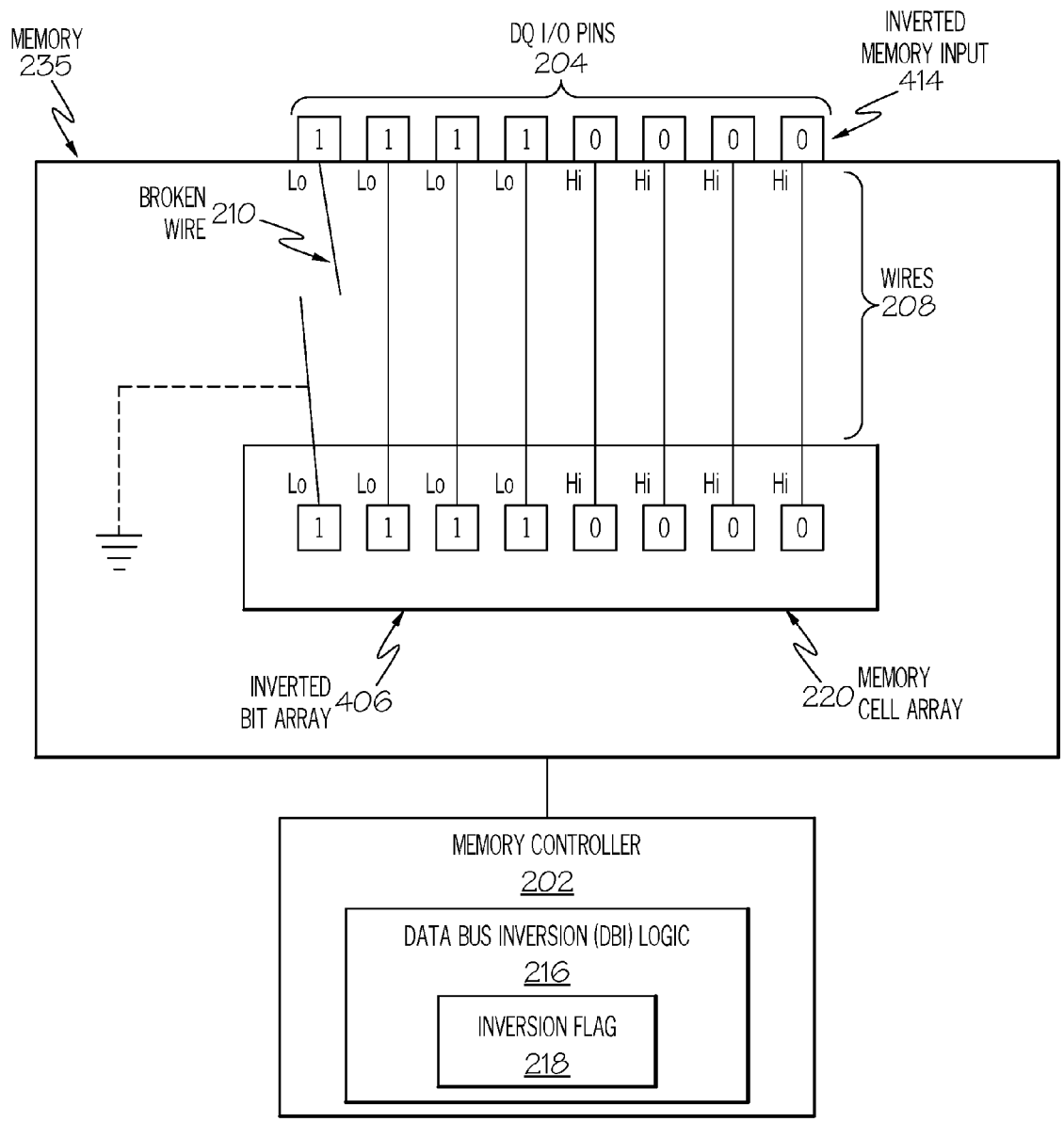
FIG. 4 illustrates the original bit array being inverted at the input/output interface of the memory shown in FIG. 3.

However, as shown in FIG. 4, the DBI logic 216 has inverted the byte at the DQ I/O pins 204 to create the inverted memory input 414 of 1111,0000 (the inverse opposite of 0000,1111 shown in FIG. 3 as the non-inverted memory input). The inversion flag 218 is now set to "1" (indicating that the inverted bit array 406 is in fact inverted). This inversion flag 218 is associated with the inverted bit array 406 whenever it is retrieved.

In practice, the inverted bit array 406 may be re-inverted to represent the original non-inverted memory input 314 (0000,1111 shown in FIG. 3) for storage within the memory cell array 220. However, for purposes of explanation, assume that the inverted version of the byte (1111,0000) is stored in the memory cell array 220 as shown in FIG. 4.

Figure 5:
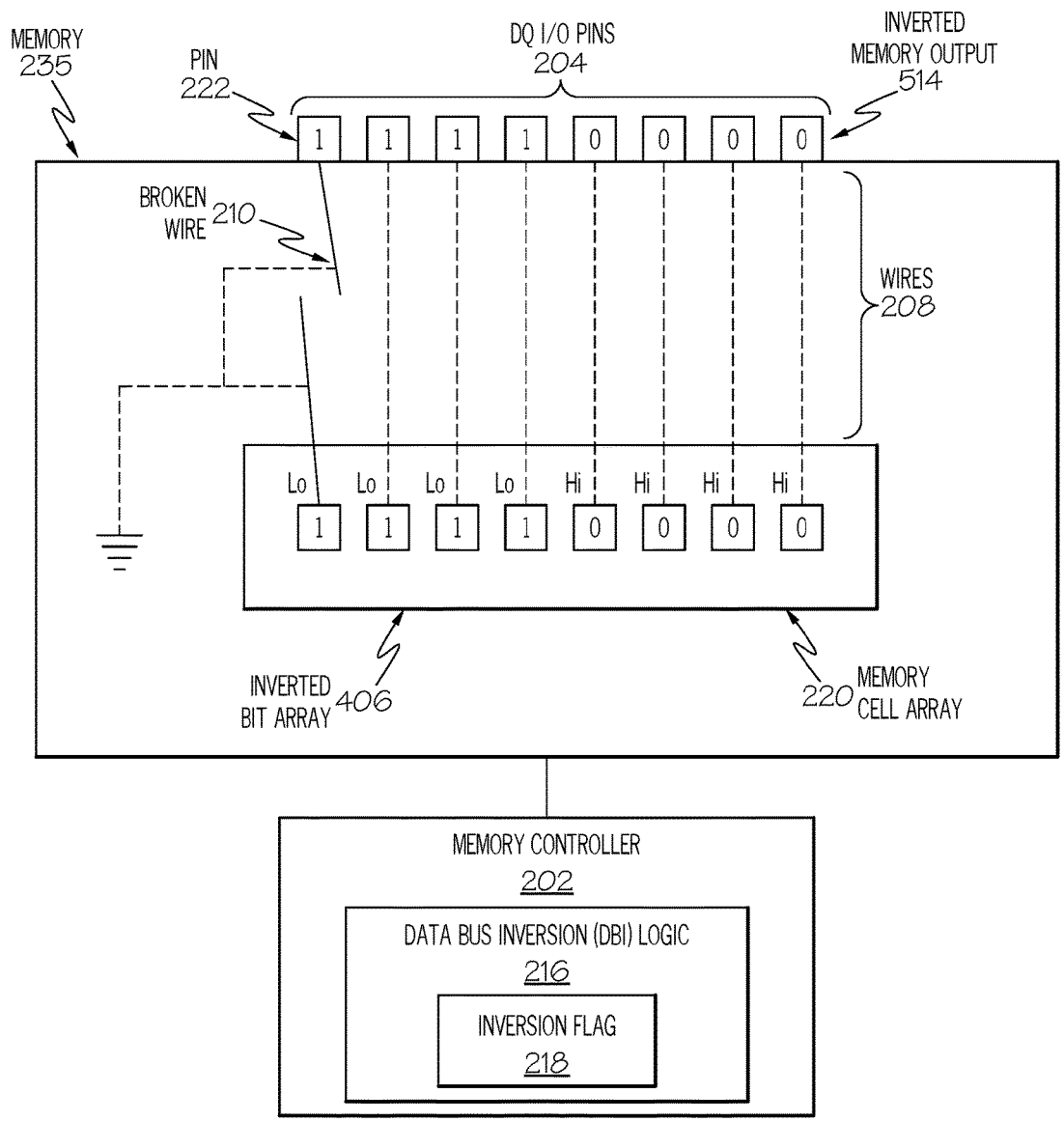
FIG. 5 depicts the inverted bit array being sent from the memory cells to the input/output interface of the memory shown in FIG. 4.
Figure 6:
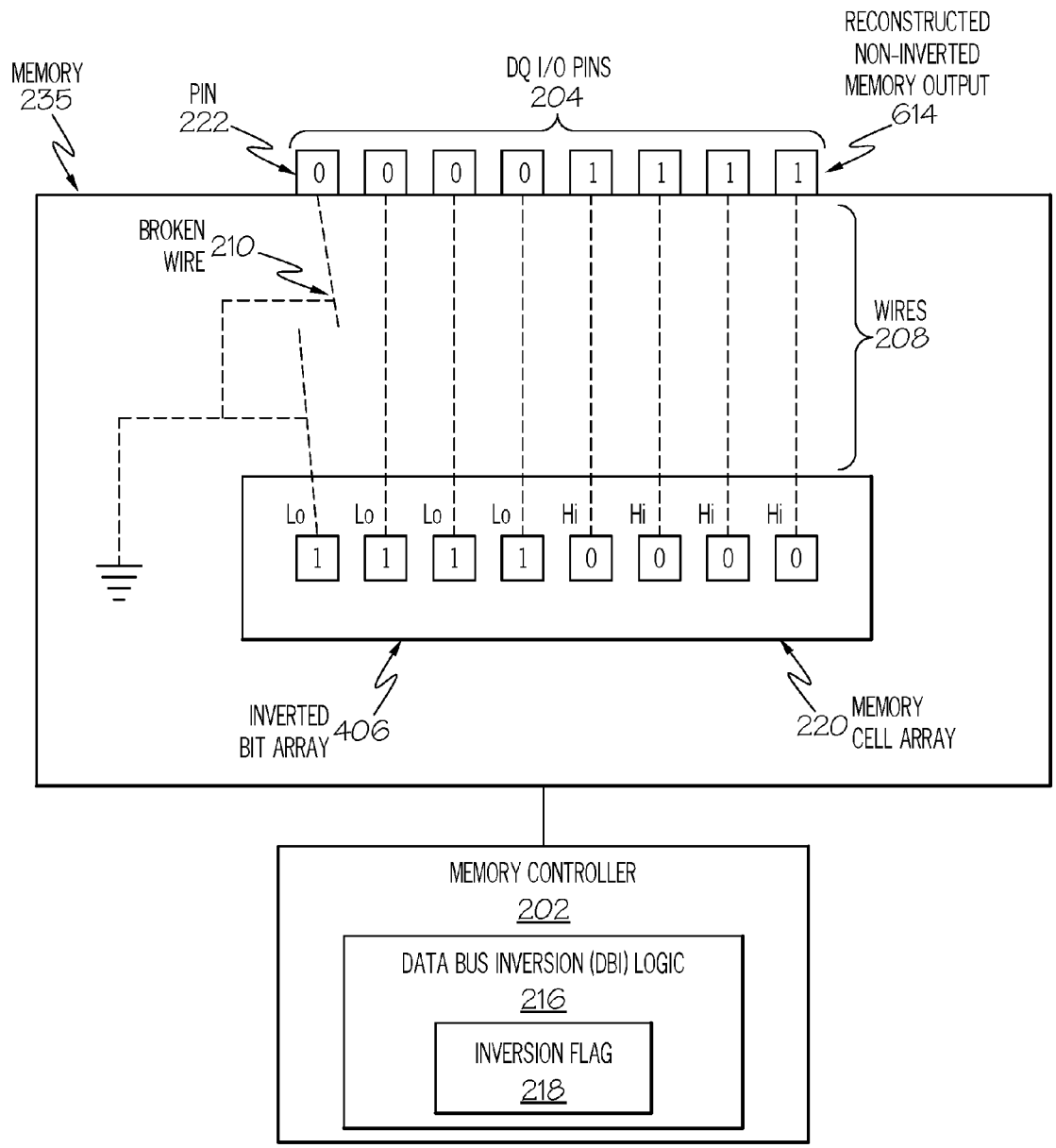
FIG. 6 illustrates the inverted bit array being re-inverted at the input/output interface, in order to reconstruct the original bit array.

With reference now to FIG. 5, assume that a request for the original byte (0000,1111) is sent to the memory 235. The inverted bit array 406 is sent to the DQ I/O pins 204 initially as the inverted memory output 514. Note that pin 222 will normally show a "1" no matter what, since it too is tied to ground by touching a ground wire, a ground substrate of memory 235, etc. At this point, the inverted memory output 514 (1111,0000) is at the D/Q I/O pins 204. However, the memory controller 202 knows (based on the setting of the inversion flag 218 in the DBI logic 216) that the byte 1111,0000 is inverted. Therefore, before sending the requested byte out to the requesting device, the DBI logic 216 will first re-invert the inverted memory output 514, in order to put a reconstituted version of the original byte (0000,1111) on the D/Q I/O pins 204 (thereby overriding the low voltage on pin 222 caused by the connection to ground), as shown in FIG. 6 as the reconstructed non-inverted memory output 614. That is, the reconstructed non-inverted memory output 614 is 0000,1111. In order to overcome the low voltage on pin 222 (caused by the broken wire 210 touching ground, which would put 1000,1111 on the DQ I/O pins 204 instead of 0000,1111), a high voltage is put on broken wire 210 in order to put 0000,1111 on the DQ I/O pins 204, or else 0000,1111 is buffered in a register (not shown) by the memory controller 202.

While bit b0 is depicted in FIG. 2-FIG. 6 as being always held at "1", bit b0 could alternatively always be held at "0"

if 1) memory 235 used a low voltage as a logical "0", or if 2) memory 235 still used a low voltage as a logical "1", but the broken wire 210 is tied to a voltage source (e.g., between 3.5 $V_{DC}$ and 5.0 $V_{DC}$ by virtue of a proximate voltage wire).

In a preferred embodiment of the present invention, an indication of whether or not a byte has been inverted is stored in a register in the DRAM (i.e., a register, not shown, within the memory 235 depicted in the figures), identifying 1) which bit in a byte should be "mapped" to DBI, and 2) if a bit should always be a 0 or a 1.

Figure 7:
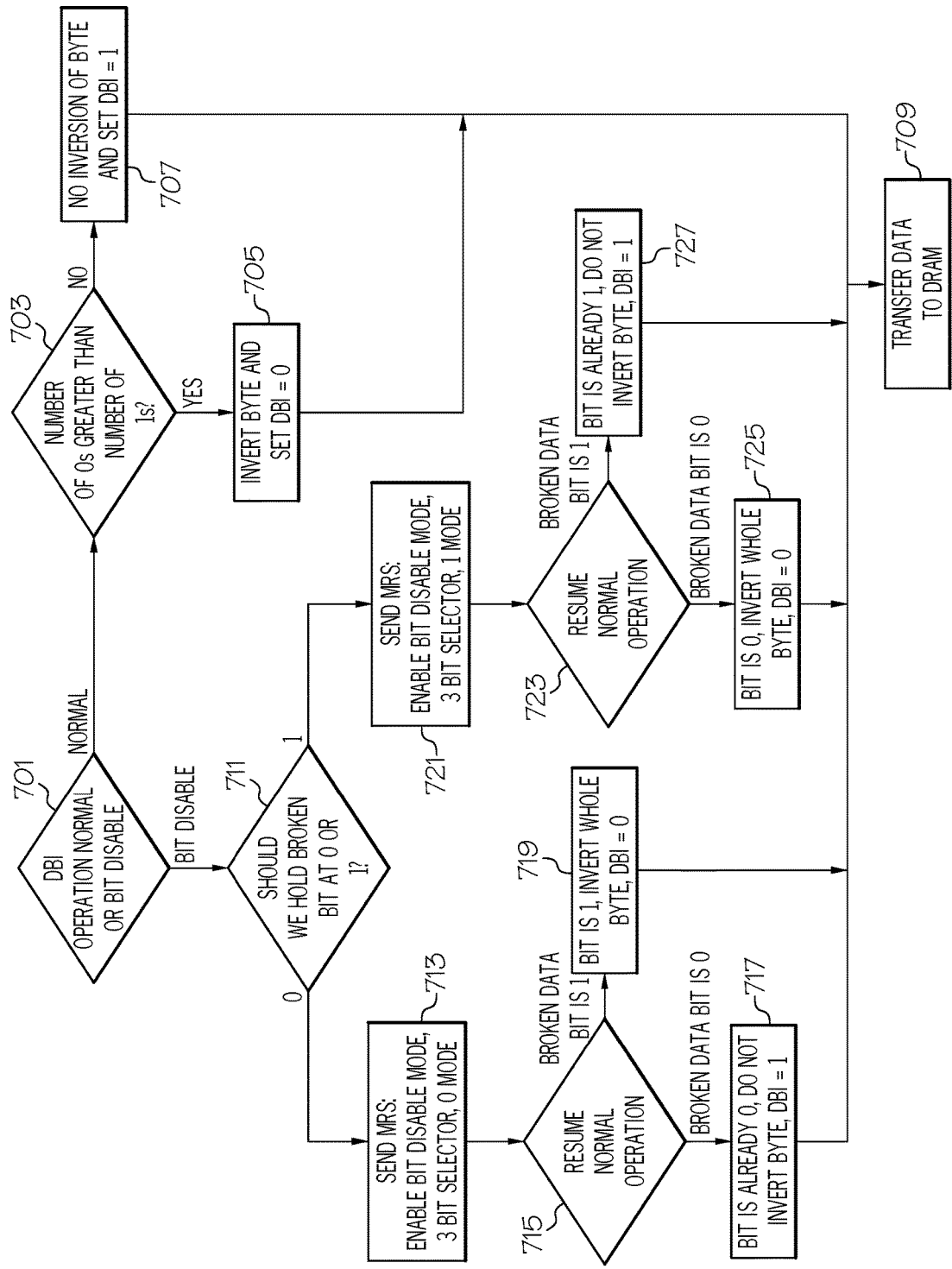
FIG. 7 is a high-level flow-chart of an algorithm for handling memory controller functions in accordance with one or more embodiments of the present invention.

With reference now to FIG. 7, a high-level flow-chart of an algorithm for handling memory controller functions in accordance with one or more embodiments of the present invention is presented.

In node 701, a determination is made as to whether the DBI operations described above are normal. If so, then a query is made as to whether or not the number of 0's in the byte is greater than the number of 1's in the byte (node 703). If there are more 0's than 1's in the byte, then the DBI inverts the bits and sets the DBI flag to "0" (high voltage) (node 705), and the inverted data/byte is transferred to the DRAM for storage (node 709), such as within the memory cell array 220 shown in FIG. 2. However, if there are fewer 0's than 1's in the byte, then the DBI does not invert the bits (node 707) and sets the DBI flag to "1" (low voltage), and the non-inverted data/byte is transferred to the DRAM for storage in the non-inverted state (node 709).

Returning to node 701, if DBI operation is adjusted in the manner described above (for curing a problem caused by a broken wire), then the affected bit is effectively disabled by locking it into the value of "0" or "1" (node 711). If the bit is to be locked onto the value "0" (node 713), normal operation resumes in order to determine if the broken data bit is a "0" or a "1" (node 715). If the broken bit is already a "0" as described above, then no action is needed by the DBI logic, and the DBI flag is set to "1" (low voltage), as shown in node 717. However, if the broken bit is a "1" as described above, then the whole byte is inverted, and the DBI flag is set to "0" (high voltage), as shown in node 719. As shown in FIG. 7, the byte/data is transferred to DRAM after the operations in node 717, node 719, node 725, and/or node 727 are performed.

Returning to node 711, if the bit is to be held at the value "1" (node 721), the normal operation is initially resumed (node 723). If the initial broken data bit is a "0", then the whole byte is inverted (node 725). Otherwise (if the initial broken data bit is a "1"), then, no data bit inversion is performed/required.

Figure 8:
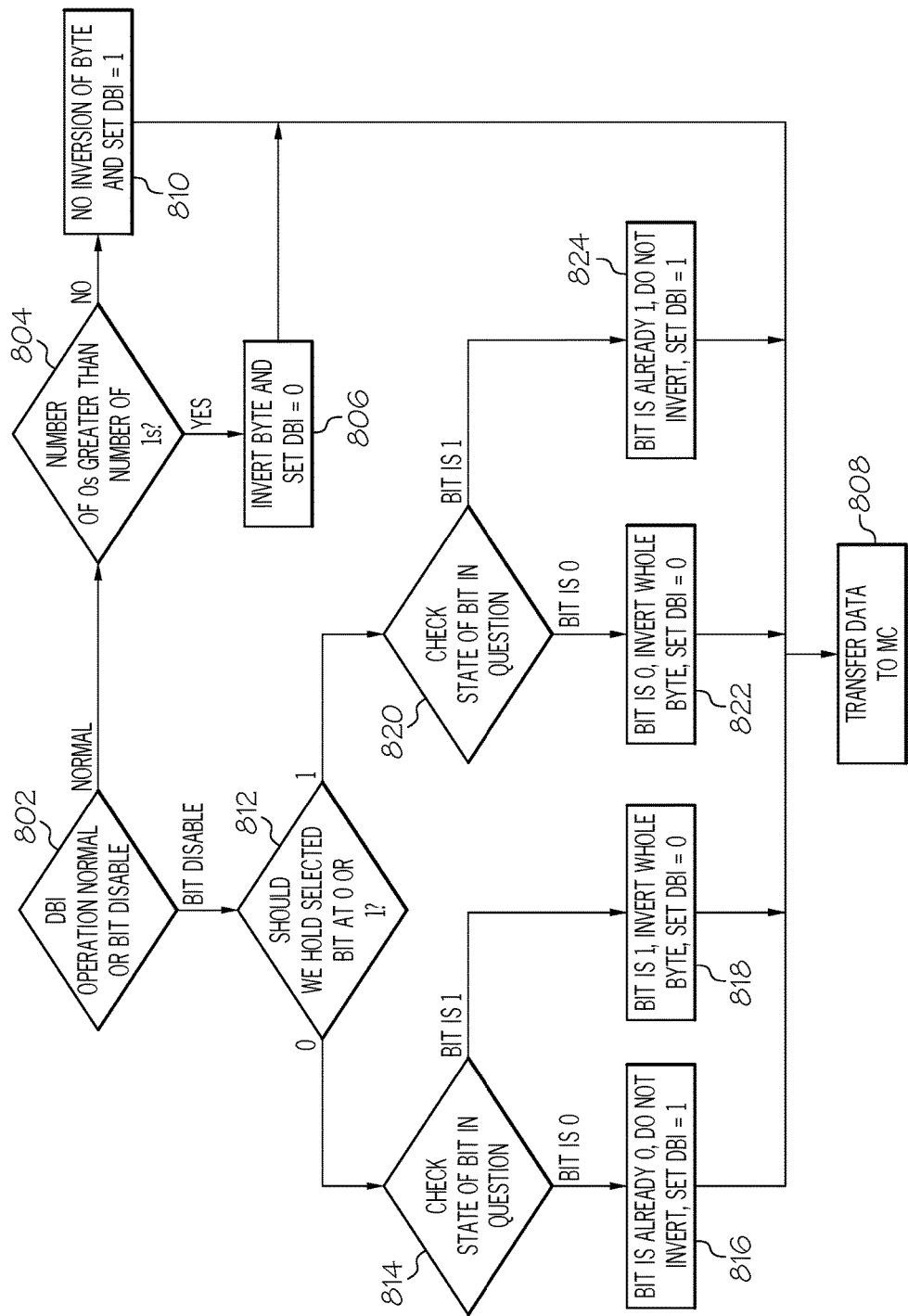
FIG. 8 is a high-level flow-chart of an algorithm for handling DRAM read functions in accordance with one or more embodiments of the present invention.

With reference now to FIG. 8, a high-level flow-chart of an algorithm for handling DRAM read functions in accordance with one or more embodiments of the present invention is presented.

In node 802, a determination is made as to whether or not DBI operations are normal or not. If they are normal, then the DBI logic checks to see if the number 0's in the byte outnumber the number of 1's in the byte (node 804). If the 0's outnumber the 1's, then all bits in the byte are inverted (node 806) and the data from the DRAM is transferred to the memory controller inverted (node 808). However, if the 1's outnumber the 0's in the byte, then there is no inversion (node 810) before the byte is transferred to the memory controller (node 808).

Returning to node 802, if the DBI operations have been altered to handle a broken bit as described above, then the affected bit is effectively disabled by locking it into the value of "0" or "1" (node 812). If the bit is to be locked onto the value "0", a query is made as to the current value of the bit (node 814). If the bit is to be a "0" and is already a "0" (node 816), then no actions are required and the DBI flag is set to "1" (low voltage). However, if the bit is to be a "1", then inversion occurs such that the DBI flag is set to "0" (hi voltage), as shown in node 818.

Returning to node 812, if the bit is to be held at the value "1" (node 820), then a query is made as to what the current bit value is. If the current bit value is a "0" (node 822), then all bits in the byte are inverted. However, if the current bit value is already a "1" (node 824), then no bit inversion or other change to the byte is needed.

Figure 9:
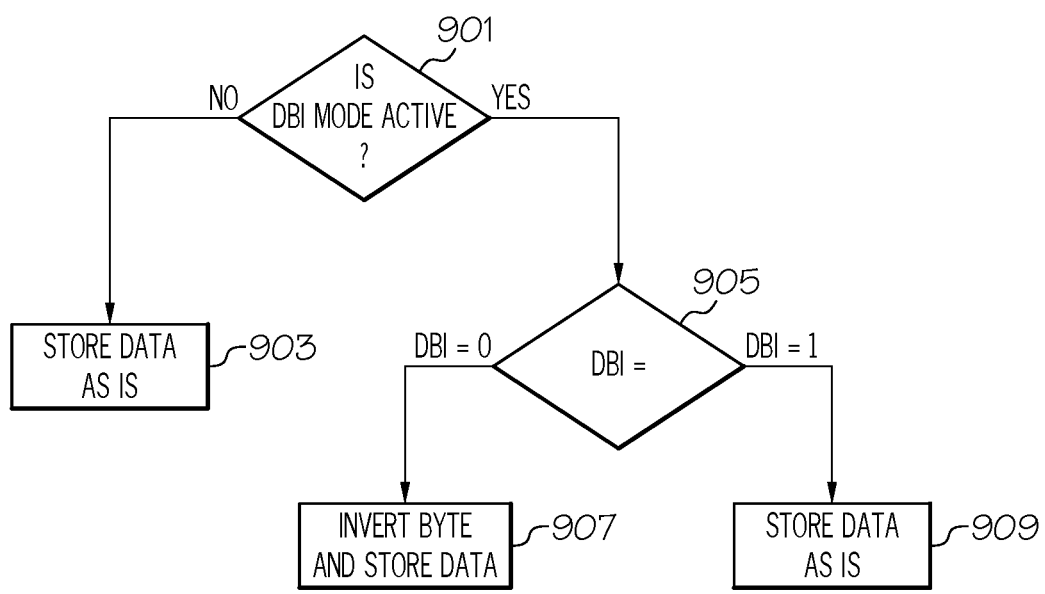
FIG. 9 is a high-level flow-chart of an algorithm for handling DRAM write functions in accordance with one or more embodiments of the present invention.

With reference now to FIG. 9, a high-level flow-chart of an algorithm for handling DRAM write functions in accordance with one or more embodiments of the present invention is presented.

A determination is made as to whether the DBI mode is active when writing to DRAM (node 901). If not, then incoming data is stored in the DRAM (e.g., memory cell array 220) in its unaltered state (node 903). However, if DBI mode is active (e.g., due to a broken bit), then a query is made to determine the DBI flag state (node 905). If the DBI flag state is "0" (high voltage), indicating that the byte needs to be inverted before being written to DRAM, then such inversion occurs before the data storage (node 907). However, if the DBI flag state is "1" (low voltage), indicating that the byte does not need to be inverted before being written to DRAM, then the byte is stored unaltered in the DRAM (node 909).

Figure 10:
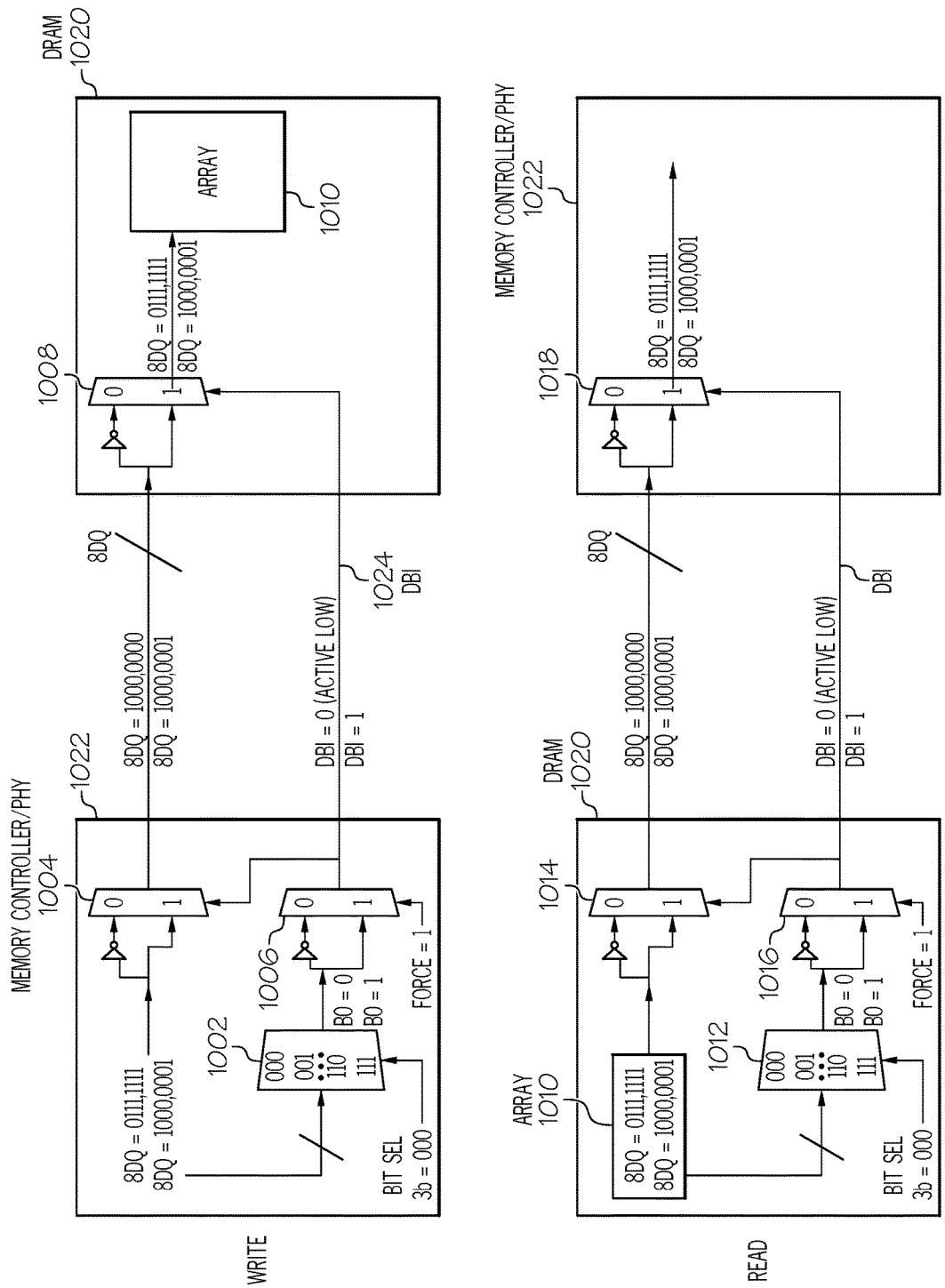
FIG. 10 depicts hardware logic used by the memory controller and a DRAM in accordance with one or more embodiments of the present invention.

With reference now to FIG. 10, hardware logic used by the memory controller 1022 (analogous to memory controller 202 shown in FIG. 2) and the DRAM 1020 (analogous to the memory cell array 220 shown in FIG. 2) in accordance with one or more embodiments of the present invention is presented.

As shown in FIG. 10, memory controller 1022 uses multiplexers 1002, 1004, and 1006 to handle the bits in the byte patterns 0111,1111 and 1000,0001 for a "Write" operation to the DRAM 1020. If the byte pattern is 0111,1111, then the bits are inverted by multiplexer 1004 for transmission to the multiplexer 1008 shown in the DRAM 1020, which includes the array 1010 (directly analogous to the memory cell array 220 shown in FIG. 2). Thus, the byte 0111,111 is written into the array 1010. However, if the byte pattern is 1000,0001, then there is no inversion (for reasons described above), and the value 1000,0001 is written into the array 1010.

When data is being read from the array 1010 in the DRAM 1020, then multiplexers 1012, 1014, and 1016 in the DRAM 1020 control whether or not the read byte is re-inverted or not. That is, multiplexer 1018 will re-invert the byte 1000,0000 to create the original byte 0111,1111 that was written to the array 1010, or else the multiplexer will read the byte as stored in the array 1010 without any re-inversion (e.g., reads the byte 1000,0001 as originally stored without any inversion).

While FIG. 3 to FIG. 6 presented above focus on how a receiving device (e.g., memory 235) handles altered received data (e.g., at the DQ I/O pins 204), FIG. 10 focuses on how a transmitting device (e.g. memory controller 1022) handles altered transmitted data.

That is, in FIG. 10, the memory controller 1022 identifies the fact that bit b0 is a "0". As such, the memory controller 1022 flips/inverts 0111,1111 into 1000,0000, which is then transmitted to the DRAM 1020. Thus, the only action the DRAM 1020 needs to perform on the received byte 1000, 000 is to 1) recognize that the byte 1000,0000 is an inverted byte (as evidenced by the signal from the DBI line 1024), and 2) then re-invert the 1000,0000 back into the original 0111,1111 for storage in the array 1010. Thereafter, when the byte 1000,0000 is read from the array 1010, the DRAM 1020 sends an inverted byte (1000,0000) to the memory controller 1022. Note that the DRAM 1020 will always put a "1" in bit b0 due to the broken/interference wire described here.

Figure 11:
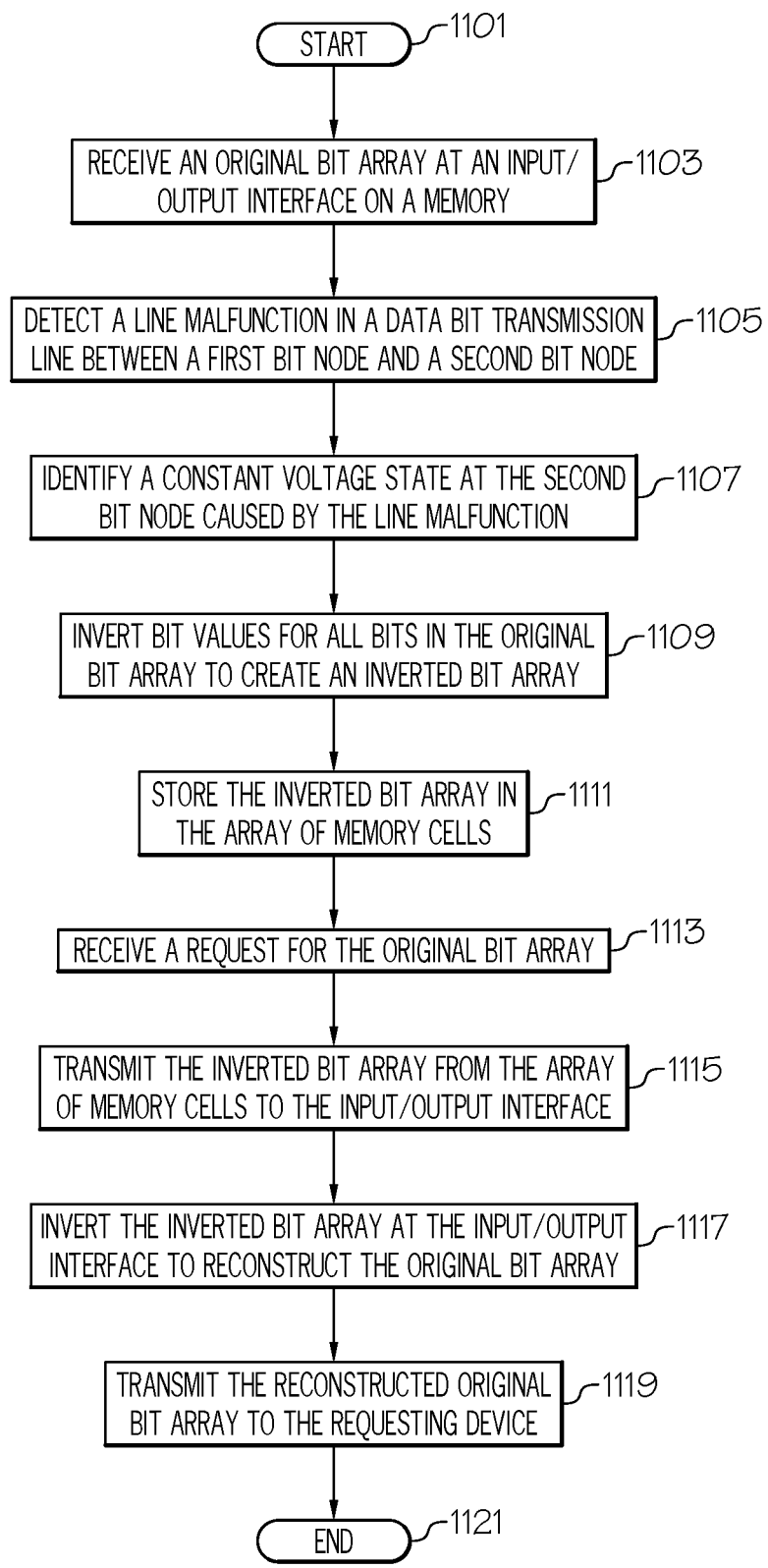
FIG. 11 is a high-level flow chart of one or more steps performed by one or more processors and/or other hardware devices to correct a data error that has been caused by a break in a conductor link (e.g., broken line) in a memory.

With reference now to FIG. 11, a high-level flow chart of one or more steps performed by one or more processors and/or other hardware devices to correct a data error that has been caused by a break in a conductor link (e.g., broken line) in a memory is presented.

After initiator block 1101, a memory (e.g., memory 235 shown in FIG. 3) receives an original bit array (e.g., a byte, nibble, etc.) at an input/output interface (e.g., DQ I/O pins 204 shown in FIG. 3) on the memory, as described in block 1103.

As described in block 1105, a memory controller (e.g., memory controller 202 shown in FIG. 3) detects a line break in a data bit transmission line (e.g., broken wire 210) between a first bit node (e.g., pin 222) and a second bit node (e.g., memory cell 212). As described herein, the first bit node is in the input/output interface in the memory, the second bit node is in an array of memory cells (e.g., memory cell array 220) in the memory, the transmission line was architected to transmit a bit value from the first bit node to the second bit node (if it were not broken), and the bit value is part of the original bit array (e.g., the original byte 0000,1111 described in the figures) received at the input/output interface.

As described in block 1107, in response to detecting the line break, the memory controller identifies a constant voltage state (e.g., low, such as less than 0.5 $V_{DC}$) at the second bit node that is caused by the line break (e.g., by being tied to ground).

As described in block 1109, in response to determining that the constant voltage state is non-representative of the bit value intended to be transmitted from the first bit node to the second bit node (i.e., low voltage does not represent the "1" found at the pin 222), an inversion logic (e.g., DBI logic 216 shown in FIG. 4) inverts bit values for all bits in the original bit array to create an inverted bit array (e.g., inverts 0000, 1111 to 1111,0000 as described in FIG. 4).

As described in block 1111, the memory controller stores the inverted bit array (e.g., inverted bit array 406 shown in FIG. 4) in the array of memory cells (memory cell array 220).

As described in block 1113, a request is received by the memory 235 from a requesting device (e.g., one of the other systems 155 shown in FIG. 1) for the original bit array (assuming that computer 101 has the requested byte-bit array).

As described in block 1115, in response to receiving the request for the original bit array, the memory controller (e.g., the memory controller 202 in the computer 101) transmits the inverted bit array from the array of memory cells to the input/output interface (see FIG. 5).

As described in block 1117, the inversion logic (e.g., DBI logic 212) then inverts the inverted bit array at the input/output interface to reconstruct the original bit array (see FIG. 6).

As described in block 1119, the memory controller then transmits the reconstructed original bit array to the requesting device.

The flow-chart ends at terminator block 1121.

As described herein, when the inversion of the original bit array is performed by a data bus inversion (DBI) logic, the DBI logic marks the inverted bit array using an inversion flag (e.g., inversion flag 218) in the DBI logic. This inversion flag is thus associated with the inverted data, indicating that it needs to be re-inverted in order to reconstitute/reconstruct the original byte of data.

In an embodiment of the present invention, inverting the bits requires both 1) detection of the broken wire as described herein and 2) detection of more than a predetermined quantity of zeros in the original byte. This results in both power savings (due to the quantity of zeros in the byte) as well as the ability to reconstruct the byte when read out of memory. Thus, in this embodiment the DBI logic detects that the original bit array (byte, nibble, etc.) contains more than a predetermined quantity of "0" digits. The DBI logic will therefore invert the bit values for all bits in the original bit array only in response to detecting that the original bit array contains more than the predetermined quantity of "0" digits and to detecting the line break.

As described herein, in one or more embodiments of the present invention the memory discussed is a dynamic memory, such as a DDR4 DRAM.

The present invention may be implemented in one or more embodiments using cloud computing. Nonetheless, it is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 12:
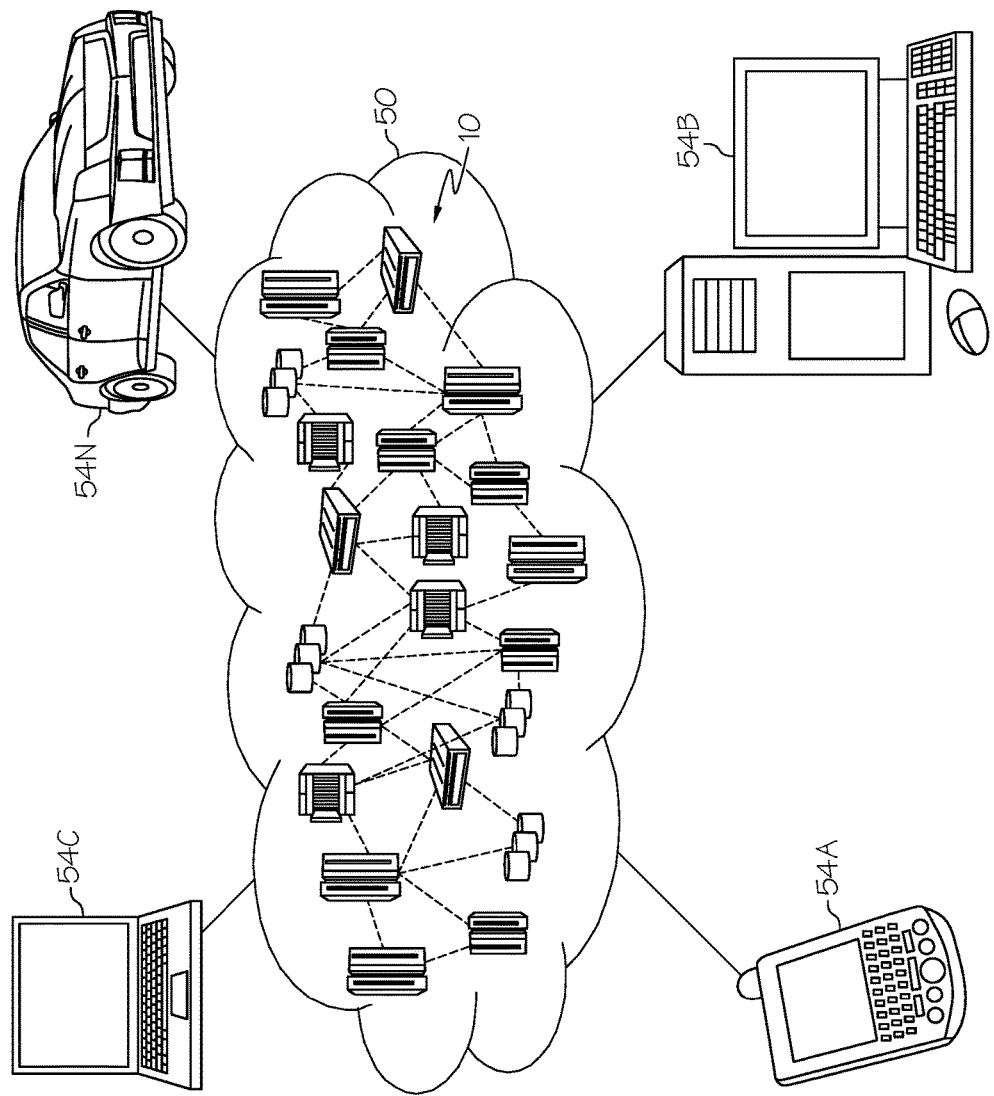
FIG. 12 depicts a cloud computing environment according to an embodiment of the present disclosure.

Referring now to FIG. 12, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-54N shown in FIG. 12 are intended to be illustrative only and that computing nodes 10 and cloud computing environment 50 can communicate with any type of computerized device over any type of network and/or network addressable connection (e.g., using a web browser).

Figure 13:
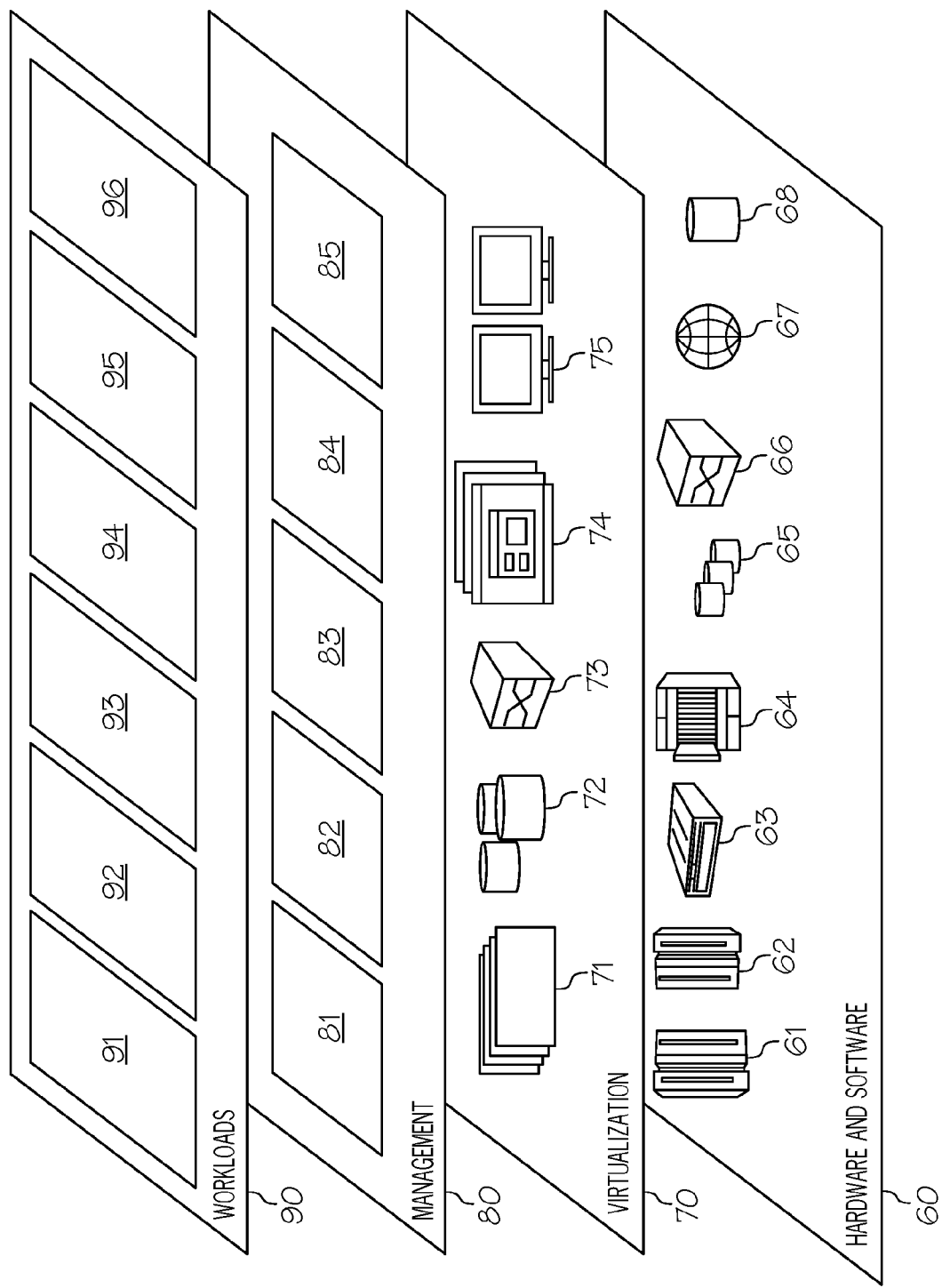
FIG. 13 depicts abstraction model layers according to an embodiment of the present disclosure.

Referring now to FIG. 12, a set of functional abstraction layers provided by cloud computing environment 50 (FIG. 13) is shown. It should be understood in advance that the components, layers, and functions shown in FIG. 13 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and memory controlling processing 96, which performs one or more of the processes described herein to correct data storage errors caused by a line break.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of various embodiments of the present invention has been presented for purposes of illustration and description, but is not intended to be exhaustive or limited to the present invention in the form disclosed. Many modifications and variations will be apparent to those of ordinary skill in the art without departing from the scope and spirit of the present invention. The embodiment was chosen and described in order to best explain the principles of the present invention and the practical application, and to enable others of ordinary skill in the art to understand the present invention for various embodiments with various modifications as are suited to the particular use contemplated.

Any methods described in the present disclosure may be implemented through the use of a VHDL (VHSIC Hardware Description Language) program and a VHDL chip. VHDL is an exemplary design-entry language for Field Programmable Gate Arrays (FPGAs), Application Specific Integrated Circuits (ASICs), and other similar electronic devices. Thus, any software-implemented method described herein may be emulated by a hardware-based VHDL program, which is then applied to a VHDL chip, such as a FPGA.

Having thus described embodiments of the present invention of the present application in detail and by reference to illustrative embodiments thereof, it will be apparent that modifications and variations are possible without departing from the scope of the present invention defined in the appended claims.

What is claimed is:

1. A method comprising:
    receiving an original bit array at an input/output interface on a memory;
    detecting, by a memory controller, a line malfunction in a data bit transmission line between a first bit node and a second bit node, wherein the first bit node is in the input/output interface in the memory, wherein the second bit node is in an array of memory cells in the memory, wherein the data bit transmission line was architected to transmit a bit value from the first bit node to the second bit node, and wherein the bit value is part of the original bit array received at the input/output interface;
    in response to detecting the line malfunction, identifying, by the memory controller, a constant voltage state at the second bit node caused by the line malfunction;
    in response to determining that the constant voltage state is non-representative of the bit value intended to be transmitted from the first bit node to the second bit node, inverting, by an inversion logic, bit values for all bits in the original bit array to create an inverted bit array;
    storing, by the memory controller, the inverted bit array in the array of memory cells;
    receiving, from a requesting device, a request for the original bit array;
    in response to receiving the request for the original bit array, transmitting, by the memory controller, the inverted bit array from the array of memory cells to the input/output interface;
    inverting, by the inversion logic, the inverted bit array at the input/output interface to reconstruct the original bit array; and
    transmitting, by the memory controller, the reconstructed original bit array to the requesting device.

2. The method of claim 1, wherein inversion of the original bit array is performed by a data bus inversion (DBI) logic, and wherein the method further comprises:
    marking the inverted bit array by an inversion flag in the DBI logic.

3. The method of claim 1, wherein the line malfunction is a line break between the first bit node and the second bit node.

4. The method of claim 1, wherein the line malfunction is line interference induced on a line between the first bit node and the second bit node.

5. The method of claim 1, wherein the first bit node is an input/output pin.

6. The method of claim 1, wherein the second bit node is a bit storage cell in the array of memory cells.

7. The method of claim 1, wherein the constant voltage state is a low voltage state that represents a "1" bit.

8. A computer program product comprising one or more computer readable storage mediums, and program instructions stored on at least one of the one or more storage mediums, the stored program instructions comprising:
    program instructions to detect a line malfunction in a data bit transmission line between a memory controller and dynamic random access memory (DRAM);
    program instructions to, in response to detecting the line malfunction, identify a constant voltage state at a bit node in the DRAM caused by the line malfunction;
    program instructions to, in response to determining that the constant voltage state is non-representative of the bit value intended to be transmitted to the DRAM, invert bit values for all bits in an original bit array to create an inverted bit array;
    program instructions to transmit the inverted bit array to the DRAM;
    program instructions to re-invert the inverted bit array to re-create the original bit array;
    program instructions to store the original bit array in the DRAM;
    program instructions to receive a request for the original bit array;
    program instructions to, in response to receiving the request for the original bit array, re-invert the original bit array to re-create the inverted bit array;
    program instructions to transmit the inverted bit array from the DRAM to the memory controller; and
    program instructions to re-invert the inverted bit array at the memory controller to re-create the original bit array.

9. The computer program product of claim 8, wherein inversion of the original bit array is performed by a data bus inversion (DBI) logic, and wherein the computer program product further comprises:
    program instructions to mark the inverted bit array by an inversion flag in the DBI logic.

10. The computer program product of claim 9, wherein the line malfunction is a line break between the memory controller and the DRAM.

11. The computer program product of claim 8, wherein the line malfunction is line interference induced on a line between the memory controller and the DRAM.

12. The computer program product of claim 8, wherein the bit node is an input/output pin on the DRAM.

13. The computer program product of claim 8, wherein the bit node is a bit storage cell in the DRAM.

14. The computer program product of claim 8, wherein the constant voltage state is a low voltage state that represents a "1" bit.

15. A computer system comprising one or more processors, one or more computer readable memories, and one or more computer readable storage mediums, and program instructions stored on at least one of the one or more storage mediums for execution by at least one of the one or more processors via at least one of the one or more memories, the stored program instructions comprising:

program instructions to receive an original bit array at an input/output interface on a memory;

program instructions to detect a line malfunction in a data bit transmission line between a first bit node and a second bit node, wherein the first bit node is in the input/output interface in the memory, wherein the second bit node is in an array of memory cells in the memory, wherein the data bit transmission line was architected to transmit a bit value from the first bit node to the second bit node, and wherein the bit value is part of the original bit array received at the input/output interface;

program instructions to, in response to detecting the line malfunction, identify a constant voltage state at the second bit node caused by the line malfunction;

program instructions to, in response to determining that the constant voltage state is non-representative of the bit value intended to be transmitted from the first bit node to the second bit node, invert bit values for all bits in the original bit array to create an inverted bit array;

program instructions to store the inverted bit array in the array of memory cells;

program instructions to receive a request for the original bit array;

program instructions to, in response to receiving the request for the original bit array, transmit the inverted bit array from the array of memory cells to the input/output interface;

program instructions to invert the inverted bit array at the input/output interface to reconstruct the original bit array; and program instructions to transmit the reconstructed original bit array to the requesting device.

16. The computer system of claim 15, wherein inversion of the original bit array is performed by a data bus inversion (DBI) logic, and wherein the computer system further comprises:

program instructions to mark the inverted bit array by an inversion flag in the DBI logic.

17. The computer system of claim 16, further comprising:

program instructions to detect, by the DBI logic, that the original bit array contains more than a predetermined quantity of "0" digits; and program instructions to invert the bit values for all bits in the original bit array only in response to detecting that the original bit array contains more than the predetermined quantity of "0" digits and to detecting the line malfunction.

18. The computer system of claim 15, wherein the memory is a dynamic memory.

19. The computer system of claim 15, wherein the first bit node is an input/output pin.

20. The computer system of claim 15, wherein the second bit node is a bit storage cell in the array of memory cells.

\* \* \* \* \*